United States Patent [19]
Owen

[11] Patent Number: 6,026,140
[45] Date of Patent: Feb. 15, 2000

[54] LOW POWER PROGRAMMABLE RIPPLE COUNTER

[75] Inventor: Jeffrey R. Owen, Portland, Oreg.

[73] Assignee: Seiko Communications Systems Inc., Beaverton, Oreg.

[21] Appl. No.: 09/063,957

[22] Filed: Apr. 21, 1998

[51] Int. Cl.[7] .................................................. G06M 3/00
[52] U.S. Cl. .............................. 377/51; 377/52; 377/110; 377/116
[58] Field of Search .................................... 377/110, 116, 377/51, 52

[56] References Cited

U.S. PATENT DOCUMENTS

5,737,381  4/1998  Shimomura et al. ...................... 377/52

*Primary Examiner*—Margaret R. Wambach
*Attorney, Agent, or Firm*—Elmer Galbi

[57] ABSTRACT

A ripple counter becomes programmable by use of intervening circuitry selectively inhibiting state transitions according to an initial programming step. The illustrated embodiment of a programmable ripple counter includes a forward chain of count registers operating generally in the fashion of a ripple counter, but selectively inhibited by an intervening control signal originating from a reverse chain of control registers. By selectively controlling the number of state transitions inhibited and by selectively controlling the number of registers participating in the counting operation, a low power general purpose programmable ripple counter results.

17 Claims, 7 Drawing Sheets

LOW POWER PROGRAMMABLE RIPPLE COUNTER

FIELD OF THE INVENTION

The present invention relates generally to digital circuitry and operation, and particularly to programmable counting devices.

BACKGROUND OF THE INVENTION

A digital counter receives a counter clock input signal and change, state, e.g., increments or decrements a digital value, in response to each cycle of the counter clock input signal. The digital value represents the number of counter clock input cycles occurring since a previous reset or load event. A digital counter can operate as a clock frequency divider by providing in response to a high frequency counter clock input a corresponding but lower frequency clock output signal.

Digital counters generally fall into two categories, ripple counters and synchronous counters. A ripple counter includes a sequence of flip-flop registers each toggling state in response to an edge-triggered, e.g., falling or rising edge, input. The first flip-flop register receives at its edge-triggered input the counter clock input signal and produces a "Q" output signal representing its state. Each successive flip-flop register receives at its input a representation of the previous register state, i.e., the Q output value of the previous register. The Q output of the last register is the output of the counter. State changes in the registers occur serially, i.e., ripple through, the counter. The counter as a whole can achieve a stable state in relation to a particular cycle of the counter clock input only after a varying delay dependent on the number of registers making a transition in response to the particular cycle of the counter clock input. In other words, the registers of a ripple counter do not all change state at a given time, but the state changes occur in a sequence rippling along from the first to the last register. A synchronous counter includes a number of flip-flop registers also responsive to a counter input clock signal and their collective state represents the number of counter clock input signal transitions since a prior reset or load event. In a synchronous counter, however, the registers are all clocked at every cycle in the counter clock input and the output state for all are concurrently valid in parallel. Thus, ripple counters and synchronous counters differ with respect to the timing of counter state validity in relation to the clock input.

Generally, either a programmable counter loads a particular number and counts up or down to zero or it counts up from zero to a particular value. In any case, the counter both loads and compares particular values which determine the frequency of the counter output in relation to the frequency of the counter clock input. To operate as a programmable counter, the contents of the counter must be read in parallel to detect a terminal state, i.e., to determine whether the counter has counted to a given value, and subsequently the counter must be loaded with a particular value.

Ripple counters have limited programmability, i.e., limited to counting according to powers of two because of the long delay needed to achieve a stable state. More particularly, delay in state transition down the sequence of registers of a ripple counter, the number of registers employed in a ripple counter, and the frequency of the counter clock input limits use of ripple counters as programmable counters. The greater the number of registers used in the sequence the greater the delay until state stability in response to the counter clock input, i.e., the greater delay in propagation of state changes along the ripple counter. For a high-speed counter clock input, the propagation delay along the ripple counter typically exceeds the counter clock input period thereby making ripple counters generally of limited value in a high-speed circuits. For applications allowing frequency divide according to only powers of two, ripple counters are acceptable frequency-divide circuits. The state of each register represents a count cycle according to a power of two and a clock output signal may be taken as the state of a selected register. However, such ripple counters typically cannot operate as general purpose programmable frequency divide circuits, i.e., capable of dividing the clock input by an arbitrary number, because there is no opportunity to read a stable counter state when the counter input clock period is less than the total propagation delay through the ripple counter.

For example, in a ten-bit ripple counter used as the programmable counter in an RF synthesizer, the total potential delay through the ten flip-flop registers could exceed the typical high frequency input clock periods of such an RF synthesizer. If, on a given input clock cycle, the counter is to toggle all ten flip-flops, then the resulting propagation delay through the entire ripple counter exceeds the input clock period and at no time is there an opportunity to read valid state data from the counter prior to the next input clock cycle.

Because synchronous counters present valid data concurrently at each register, synchronous registers are typically required when implementing a high-speed general purpose programmable counter.

Unfortunately, synchronous counters present problems with respect to power consumption in certain implementations. Power consumption for a counter becomes a concern in certain implementations, especially for a high-speed synchronous counters. In some logic families, power consumption can be optimized for certain frequencies wherein the higher the maximum allowed frequency, the greater the power requirements. In other families, e.g., CMOS, logic circuits consume power in approximate proportion to the frequency of operation. In a synchronous counter, all registers operate at the highest frequency, the frequency of the counter input clock. As a result, the power consumed by a synchronous counter is proportional to the frequency of the counter input clock times the number of registers.

A ripple counter, on the other hand, has significantly lower power consumption because registers other than the first are not necessarily clocked for each cycle in the clock input. For example, the first register in a ripple counter operates at the frequency of the input clock and its power consumption is proportional to the frequency of the input clock. The second register in a ripple counter is clocked at half this frequency consuming only one-half as much energy as the first register. For the third register, only one-quarter as much energy. Each successive register in a ripple counter consumes half as much power as the previous register. As the number of registers in a ripple counter approaches infinity, the total power consumption for the ripple counter approaches only twice that of the first register. Accordingly, ripple counters have significant advantage relative to synchronous counters with respect to power consumption especially in certain logic families, e.g., in CMOS implementations.

Thus, while ripple counters offer advantage with respect to power consumption they present disadvantage with respect to programmability. Synchronous counters are fully programmable, but present disadvantage with respect to power consumption. The circuit designer must choose between these advantages and disadvantages when implementing a counter in a high speed circuit.

Another approach used to divide or "slow down" clock speed for a portion of a programmable counter is known as variable modulous prescalar. Generally, such a counter includes a first group of flip-flops operating at the full input clock frequency which is semi-programmable, i.e., can be programmed to divide by N or to divide by (N+1). This portion of the counter is a high-speed counter using a limited number of bits and dividing by one of two preselected numbers typically separated by one. For example, the preselected numbers may be 31 and 32 or may be 15 and 16. In any case, a control line applies to this high-speed counter portion and determines which of the preselected numbers it will divide by. A second, slow-speed programmable counter portion follows and is clocked by the output of the high-speed portion. Both the high-speed counter portion and the slow-speed counter portion are traditionally synchronous counters. As a result, less high-speed circuitry is required and generally less power is consumed.

Accordingly, it would be desirable to provide a programmable high-speed counter having reduced power consumption and ability to divide an input clock by an arbitrary value. The subject matter of the present invention provides such a programmable counter.

SUMMARY OF THE INVENTION

A low power programmable ripple counter according to the present invention includes a series of count registers each toggling state in response to a triggering event at an input thereof. A first one of the count registers receives the counter clock input signal. The other count registers each receive as an input signal the state of the previous one of the count registers. The last register provides a counter clock output signal. The ripple counter becomes programmable by introduction of intervening circuitry selectively inhibiting toggling for selected ones of the count registers. By removing one clock cycle from the first count register, the period of the counter output increases by one counter input cycle. By removing a state transition from the second court register, two cycles in the counter clock input are ignored and the counter clock output cycle increases by two input clock cycle periods. Inhibiting state transition at other count registers increases the counter output signal by a particular number of counter input cycle periods. Thus, according to one aspect of the invention, a ripple counter becomes programmable by use of intervening circuitry selectively inhibiting certain state transitions in a sequence of count registers. According to another aspect of the invention, the effective length of a series of count registers may be reduced. Overall, the counter output signal has a selected period based on control over the number of skipped state transitions and over the number of count registers participating in the counting operation. The counter thereby exhibits low power consumption due to its basic ripple counter architecture but enjoys a broad and continuous range of programmability.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE PREFERRED EMBODIMENT

Figure 1:
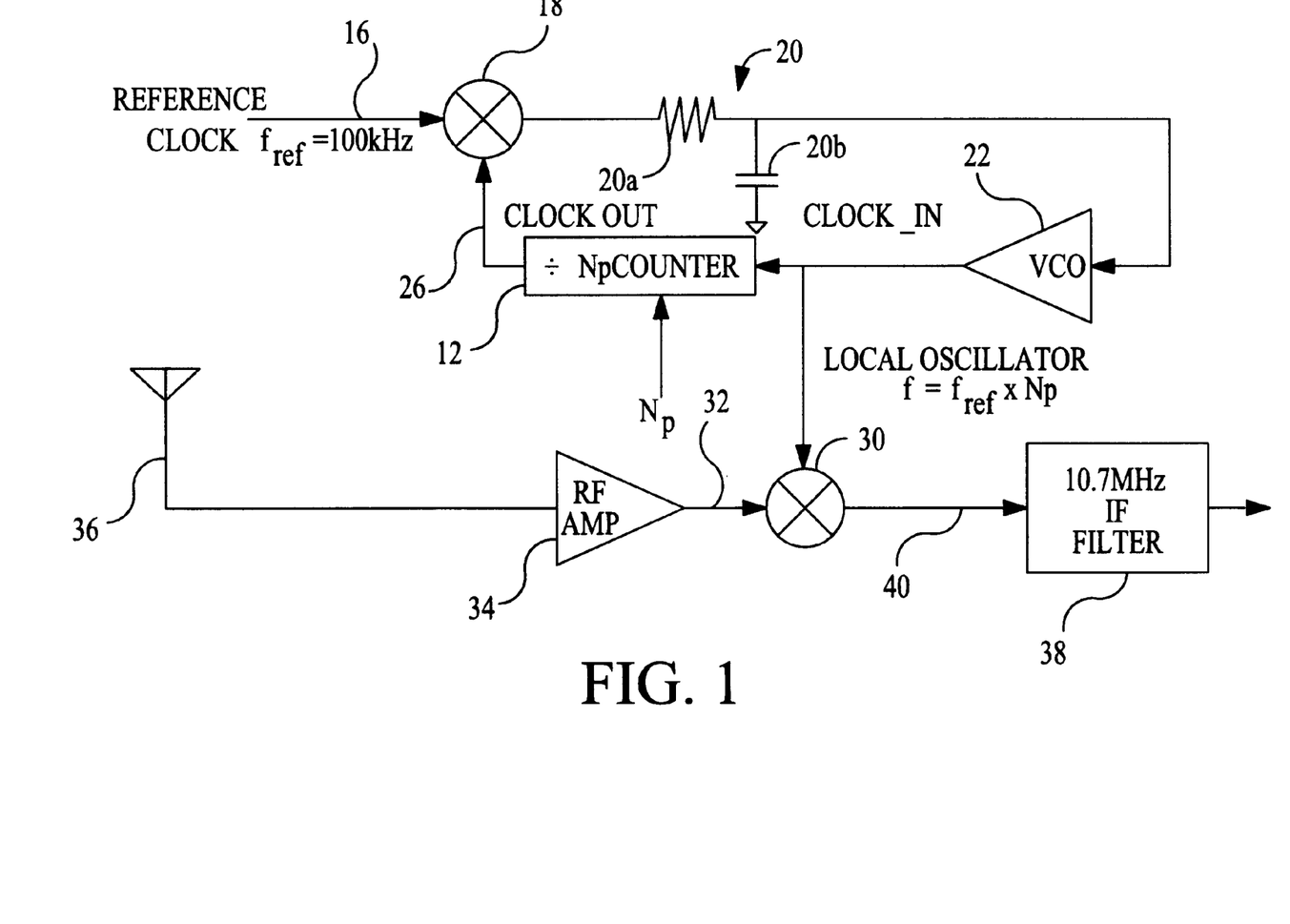
FIG. 1 illustrates a low power programmable ripple counter according to the present invention as applied in the context of a high-speed FM radio receiver synthesizer circuit.

FIG. 1 illustrates an FM radio receiver 10 using a high-speed programmable counter 12 according to a preferred embodiment of the present invention. This particular type of receiver is known as a superhetrodyne receiver and requires a local oscillator typically implemented, in modern circuits, by a frequency synthesizer using a digital counter. Counter 12 operates in the synthesizer portion of FM radio receiver 10 to produce a local oscillator signal 14. A reference clock 16 operates at a known frequency, e.g., 100 kHz, and provides a frequency "step size" for FM radio receiver 10. Preferably, reference clock 16 operates at the highest possible frequency to establish the maximum synthesizer frequency step size which still makes available all the channel frequencies in the FM band.

Reference clock 16 applies to one input of a phase or frequency detector 18. Detector 18 provides its output to a low pass filter 20, including a resistor 20a and a capacitor 20b. The output of low pass filter 20 applies to the control input of a voltage controlled oscillator (VCO) 22. The VCO 22 applies its output as a CLOCK_IN signal 24 to high-speed programmable counter 12. Counter 12 receives, in a prior programming step, a static value $N_p$. The value $N_p$ establishes a CLOCK_OUT signal 26 frequency. Counter 12 must possess a broad and continuous range of programmability. Once stabilized, local oscillator signal 14 has a frequency equal to that of the reference clock 16 frequency times the value $N_p$.

The local oscillator signal 14 applies to a mixer 30. Mixer 30 also receives the output 32 of a radio frequency amplifier 34 as coupled to an antenna 36. The frequency of the desired RF signal 32 will be 10.7 MHz below the frequency of the local oscillator signal 14. These two signals, the desired RF signal 32 and the local oscillator signal 14, combine in mixer 30 to produce a signal 40 with frequency equal to the difference between the two frequencies, or in this case 10.7 MHz. This signal 40 is then amplified by an IF filter which consists of necessary filters and amplifiers to selectively amplify signals at 10.7 MHz. To tune an RF signal with frequency 100.1 MHz, the local oscillator should be set to 110.8 MHz to establish mixer output 40 at 10.7 MHz. With reference clock 16 operating at 100 kHz, high speed programmable counter 12 receives an $N_p$ value of 1108. As may be appreciated, to tune radio 10 to other frequencies counter 12 receives different value $N_p$.

Thus, counter 12 operates at high frequency and reacts through programming, i.e., operates in response to an arbitrary value $N_p$, to establish the required local oscillator signal 14 frequency. In accordance with its preferred use, high-speed programmable counter 12 is a low power consumption device when implemented by virtue of its basic ripple counter architecture under the present invention.

While illustrated in the context of an FM radio 10 synthesizer circuit, the present invention finds application in a variety of devices. Also, while counter 12 would require 10 bits for implementation under the present invention, the present invention will be illustrated in detail by reference to a 3-bit ripple counter structure. It will be appreciated, however, that the 3-bit architecture illustrated and described here-in may be expanded in direct fashion to as many registers as necessary. The structure and operation of a counter as provided under the present invention will first be illustrated by introducing a mechanism by which a ripple counter becomes programmable. Once this mechanism is described, a more detailed implementation of a programmable ripple counter will be discussed.

A traditional ripple counter ties each Q output directly to the clock input of the next flip-flop register. The counter clock input signal is applied to the clock input of the first flip-flop register and the Q output of a selected register provides a counter clock output signal with the frequency divided according to a select power of two. In such traditional ripple counter architecture, the frequency of the first Q output is one-half the counter clock input, the frequency of the second Q output is one-quarter the counter clock input and the frequency of the third Q output is one-eighth the frequency of the counter clock input. Such architecture provides frequency division only according to powers of two.

Under the present invention, however, a ripple counter is made programmable by intervening circuitry between the registers. Under one form of the invention, intervening circuitry selectively removes clock cycles normally delivered from one register to a next successive register. Under another form of the invention, intervening circuitry selectively inhibits a state change in a given register in response to a clock cycle from a preceding register state change. By appropriately selecting such intervening events, e.g., removing clock cycles or inhibiting state changes at selected registers, a counter assuming a ripple counter architecture becomes programmable. Generally, a programmable ripple counter under the present invention includes two series or chains of flip-flop registers. A forward chain of registers operates generally in the fashion of a ripple counter, but state changes in particular registers may be selectively inhibited by an intervening control signal originating from a reverse chain of registers.

Figure 2:
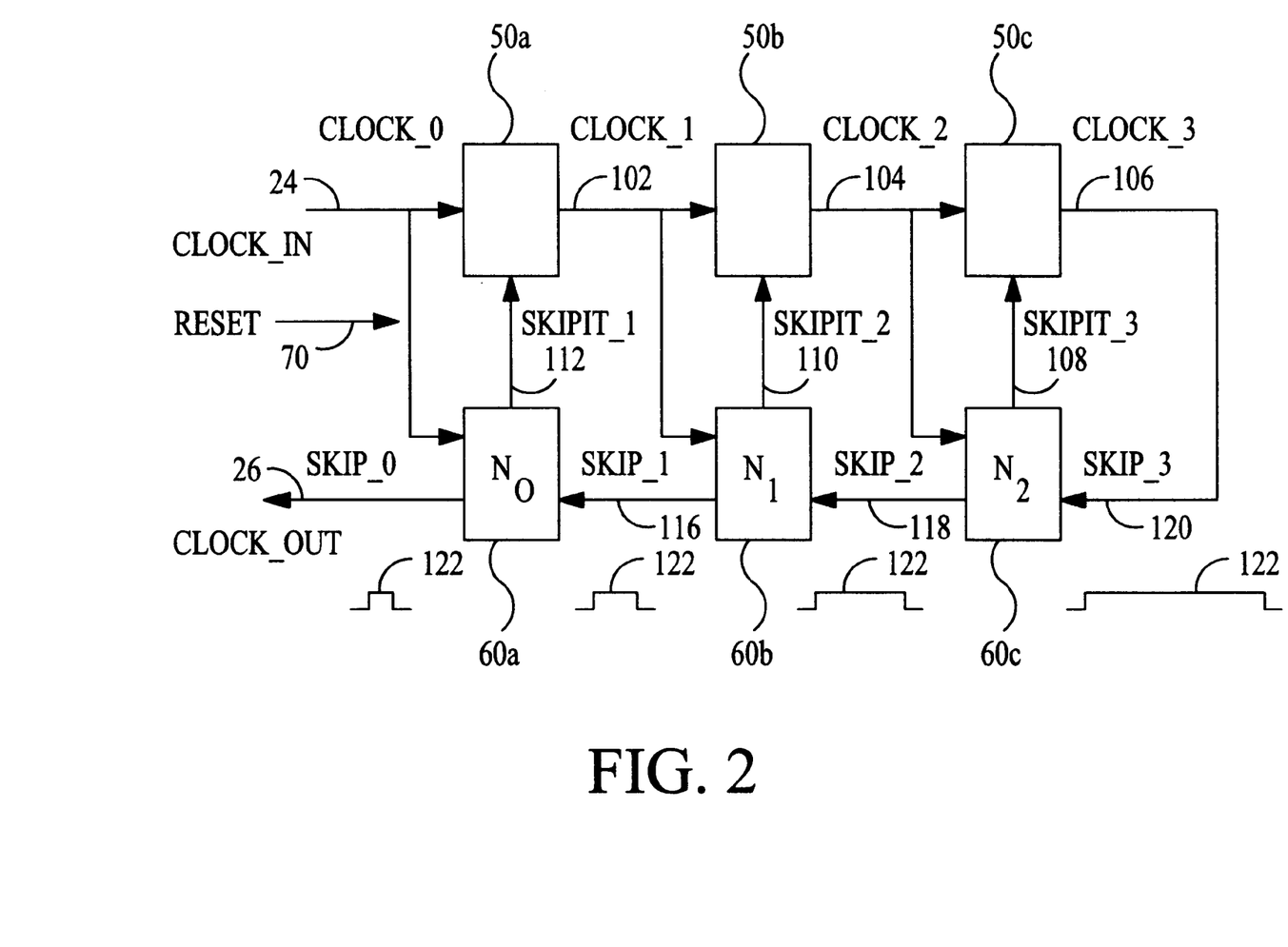
FIG. 2 illustrates stages in a ripple counter architecture made programmable in accordance with the present invention by use of intervening circuitry selectively inhibiting state transitions for particular registers.

FIG. 2 illustrates by simplified block diagram a sequence of count registers 50, individually 50a–50c, operating generally in the fashion of a ripple counter. A sequence of control registers 60, individually 60a–60c, provide intervening control over state transitions in the count registers 50 as a mechanism making the ripple counter a programmable counter. Register 60a corresponds to register 50a, register 60b to register 50b, and register 60c to register 50c. Thus, each register 60 exerts control over a corresponding one of registers 50.

Registers 50 each have an edge-triggered input and have an output representing register state. The output of a given register 50 applies to the clock input of the next successive register 50 in the fashion of a ripple counter architecture. Thus, register 50a receives the counter clock input 24, also designated CLOCK_0 in FIG. 2, and produces a CLOCK_1 (102). Register 50b receives at its clock input CLOCK_1 (102) and produces CLOCK_2 (104) for application to the clock input of register 50c. Register 50c produces a CLOCK_3 (106). Each of registers 50 also receive a SKIPIT input produced by a corresponding control register 60 and causing, when active, the register 50 to ignore a state transition event, e.g., ignore an edge event at its edge-triggered clock input. Thus, register 50a receives a SKIPIT_1 (112) input, register 50b receives a SKIPIT_2 (110) input and register 50c receives a SKIPIT_3 (108) input. Registers 50 operate in normal ripple counter fashion, e.g., toggle state in response to a falling edge clock input, except when the corresponding SKIPIT signal inhibits such normal toggling operation.

Control registers 60 operate in the fashion of a shift register, but with each register clocked by a different signal and with the data flowing in the opposite direction as that of registers 50. Registers 60 appropriately generate the SKIPIT inputs to registers 50. More particularly, control register 60c receives from the count register 50c the CLOCK_3 (106) signal as a SKIP_3 (120) input. Register 60c in turn produces a SKIP_2 (118) signal for application to register 60b. Register 60b produces a SKIP_1 (116) signal for application to register 60a. Register 60a produces a SKIP_0 signal as the counter clock output 26. Each of registers 60 also receives as clock inputs a corresponding one of the clocks 24, 102 and 104 available along the sequence of registers 50. More particularly, register 60a receives CLOCK_0 (24), register 60b receives CLOCK_1 (102), and register 60c receives CLOCK_2 (104).

A reset control 70 establishes a required initial condition resetting all registers 50 and 60 to a logic zero state. As operation commences, registers 50 operate in normal ripple counter fashion in response to CLOCK_0. In other words, state transitions propagate along the sequence of registers 50 with CLOCK_1 operating at half the frequency of CLOCK_0, CLOCK_2 operating at half the frequency of CLOCK_1, and CLOCK_3 operating at half the frequency of CLOCK_2. As state transitions of CI,OCK_3 eventually feed into the sequence of registers 60, however, SKIP_3, SKIP_2, and SKIP_1 signals propagate as a diminishing-width enable pulse 122 through registers 60 and enable assertion of active SKIPIT_3, SKIPIT_2, or SKIPIT_1 signals. A control value N dictates the active/inactive status for each of SKIPIT signals 108, 110 and 112. More particularly, control value N is an n-bit word where each bit corresponds to one of the SKIPIT signals. When asserted, i.e., logic value one, an N value bit makes active the corresponding SKIPIT signal during the time it is enabled by the corresponding SKIP signal. As explained more fully hereafter, control value N does not equal but does correspond to a counter programming value $N_p$.

Thus, SKIP signals 116, 118, and 120 provide skip enable conditions and, depending on N value programming, when enabled a corresponding SKIPIT signal is applied to a register 50. A skip enable condition always propagates as enable pulse 122 through registers 60 in SKIP_3 (120), SKIP_2 (118), and SKIP_1 (116) signals. A corresponding SKIPIT signal is generated only when enabled, i.e., enabled by the corresponding SKIP signal, and only when N value programming dictates. In other words, N value programming determines whether a SKIPIT signal is generated at the time it is enabled by a corresponding SKIP signal.

Thus the SKIP signals, i.e., SKIP_3, SKIP_2, and SKIP_1 may be viewed as propagating the enable pulse 122 along the sequence of registers 60. This enable pulse 122, however, is cut to one-half its length successively at each stage as it progresses along the sequence of registers 60. In other words, the length of enable pulse 122 when appearing in signal SKIP_2 is one-half that of SKIP_3 and twice that of SKIP_1. This accounts for the increasing frequency of clock signals CLOCK_2, CLOCK_1, and CLOCK_0 as the enable pulse 122 moves along registers 60c, 60b, and 60a.

Each of registers 60 must also hold or read one bit of the value N to determine whether or not a corresponding SKIPIT signal is to be generated in response to the enable pulse 122 presented in the corresponding SKIP signal. In the three-bit example illustrated, register 60c holds or reads the most significant bit $N_2$ of value N, register 60b the next bit $N_1$ of value N, and register 60a the least significant bit $N_0$ of value N.

Generally, the goal in manipulating clock cycles or preventing state transitions is to optionally prevent a state transition for each register 50 only once for every count cycle, i.e., once for every $N_p$ cycles in the clock input 24 where $N_p$ equals the programmed cycle count. Thus, a state transition is inhibited at most only one time for each of registers 50 for every count cycle. During a given count cycle, state transition inhibition at a given register 50 occurs only in response to the corresponding enable pulse 122 and only when the corresponding bit of the N value allows inhibition. For example, register 60c holds the most significant bit, i.e., $N_2$, and when true presents an active SKIPIT_3 (108) input to register 50c in response to the enable pulse 122 appearing in signal SKIP_3 (120). Similarly, register 60a holds the least significant bit, i.e., bit $N_0$, and presents an active SKIPIT_1 (112) signal to register 50a in response to the corresponding enable pulse 122 when it appears in the SKIP_1 (116) signal.

As illustrated and described thus far, the counter of FIG. 2 allows arbitrary programming, but within a particular range. More particularly, the counter of FIG. 2 as described provides programmability for $N_p$ values in a range between $2^n$ and $2(2^n)-1$ where n equals the number of participating count registers. In this example n equals three. In other words, the counter as described thus far can be programmed to count within a range just short of one full octave, i.e., between a given base count ($2^n$), and almost twice the given base count, $(2(2^n)-1)$. For example, the three-bit form of counter as described thus far may be programmed to count in a range between eight ($2^3$) and fifteen ($2(2^3)-1$). A ten bit counter operating as described thus far may be programmed for counting in the range between 1,024 and 2,047.

A counter according to the present invention may be further programmed in a programming step, however, to shift the range of $N_p$ value programmability and thereby provide a broad and continuous overall range of $N_p$ value programming. As will be described more fully hereafter, the length of a counter is in effect shortened by use of an additional maximum length control value M. Value M makes the effective length of the counter less than the actual number of available registers. Thus, control value M selectively disables one or more of the most significant registers 50 and 60 and thereby shifts downward the range of $N_p$ value programmability.

A SKIPIT signal when active in the presence of the enable pulse 122 causes the corresponding one of count registers 50a–50c to skip a certain number of cycles in CLOCK_IN 24. For example, an active SKIPIT_1 (112) causes the counter to ignore or skip one cycle in CLOCK_IN 24. SKIPIT_2 (110) when active causes the counter to ignore or skip two cycles in CLOCK_IN 24. SKIPIT_3 (108) causes the counter to skip four cycles in CLOCK_IN 24. Depending on a selected value for N as established in a prior programming step, a selected number of CLOCK_IN 24 cycles may be skipped and the corresponding period of CLOCK_OUT 26 increased. In the three-bit example illustrated, a value N with all bits carrying a logic value one adds an additional seven input clock cycles to a given count cycle period. With a base count of eight cycles needed to propagate state transition through registers 50a–50c and an additional seven cycles skipped via N value programming a three-bit counter can count to a maximum of fifteen. For a value N set to zero, no state transitions are inhibited and a 3-bit counter counts to eight. A selected value N adds a selected number of clock cycles to a base count established by the number of participating registers, as determined by the value M.

Figures 3A, 3B, 4:
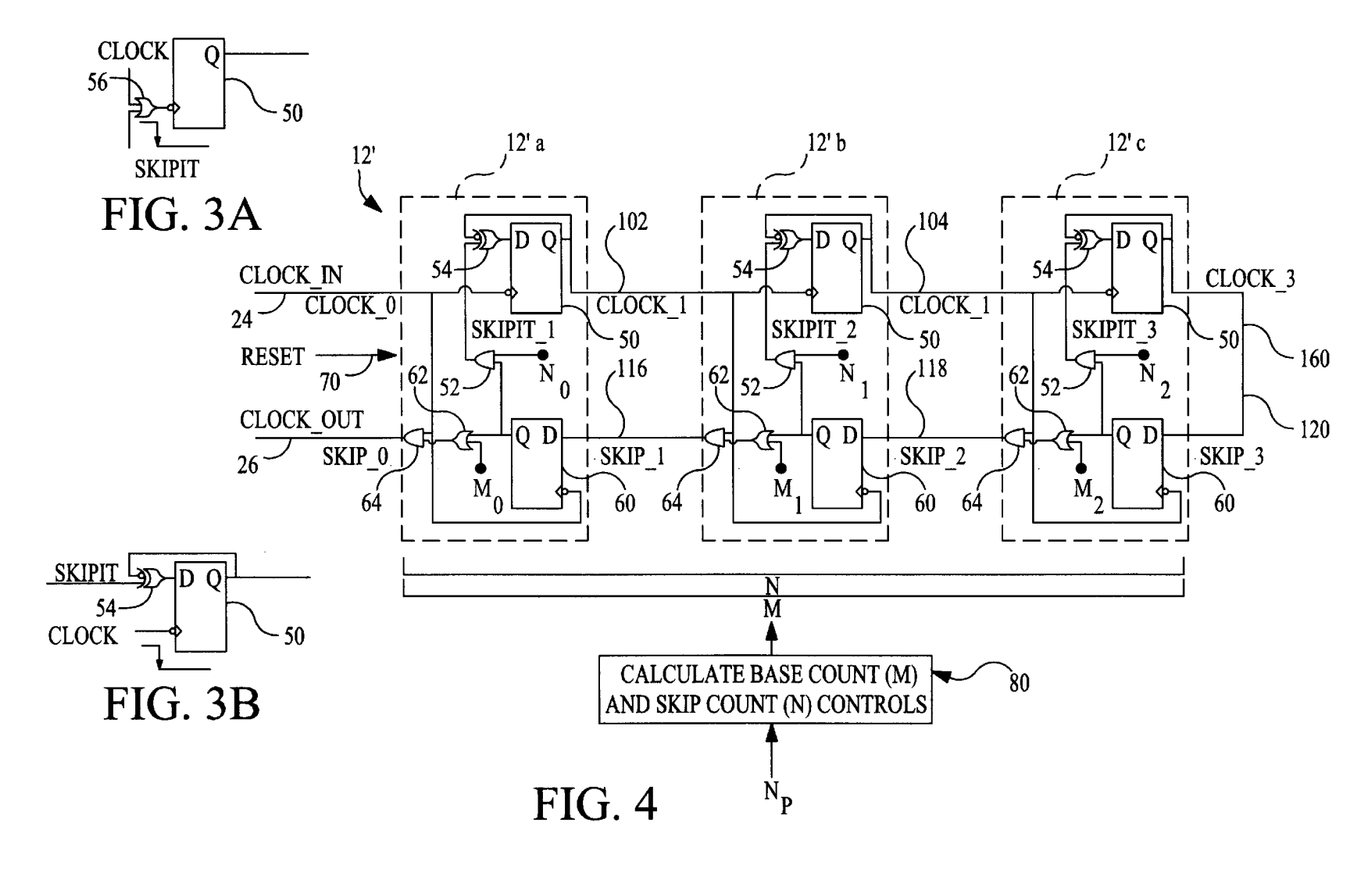
FIGS. 3A and 3B illustrate alternate circuit configurations for making programmable a ripple counter according to the present invention.
FIG. 4 illustrates in more detail a three-bit programmable ripple counter according to a preferred embodiment of the present invention.

FIGS. 3A and 3B illustrate two methods of state transition control by intervening circuitry in a ripple counter architecture. FIG. 3A illustrates a method of removing clock cycles and FIG. 3B illustrates a method of preventing state transitions through state feedback. In FIG. 3A, a clock signal, e.g., as presented from an previous register, and a SKIPIT signal, i.e., as generated from a corresponding control register 60, apply to the inputs of an OR gate 56. Thus, when the SKIPIT signal carries a logic value zero, then register 50 operates in normal fashion in response to the clock signal, e.g., by toggling state in response to a falling edge condition in the clock signal. If the SKIPIT signal carries a logic value one for the duration of the time that the register CLOCK signal is at logic value zero, then the output of OR gate 56 remains constant at logic value one and triggering events, e.g., falling edge events, in the register clock signal are in effect removed and no state transition occurs in response thereto.

In FIG. 3B, a register 50 receives directly a clock input, e.g., from the Q output of an upstream register 50, at its clock input. Register 50 includes also, however, a D input coupled to the output of an EXCLUSIVE OR gate 54. The SKIPIT signal, i.e., as generated by a corresponding control register 60, applies to one input of EXCLUSIVE OR gate 54 and an inverted form of the Q output of register 50 applies to the other input of EXCLUSIVE OR gate 54. Thus, when the SKIPIT signal carries a logic value zero the D input of register 50 carries the complement of the Q output and register 50 toggles state in response to a falling edge in the clock input. If the SKIPIT signal carries a logic value one, however, then the D input of register 50 receives the value of the Q output of register 50 and no state transition occurs in response to a falling edge event in the clock signal.

FIG. 4 illustrates in greater detail a three-bit form of a programmable ripple counter according to a preferred embodiment of the present invention. Counter 12' includes a series of cells, individually 12'a–12'c. Counter 12' may be expanded to include additional cells as necessary to construct a programmable ripple counter with higher counting capacity. The lowest order cell, e.g., cell 12'a, receives the counter CLOCK_IN 24 signal and produces the counter CLOCK_OUT 26 signal. The most significant cell, e.g., cell 12'c, couples its forward clock output to its SKIP signal input. Any number of additional cells may be interposed between the first and last cells in the manner illustrated in FIG. 4. For the present discussion, however, the counter will be described having three such cells, individually cells 12'a–12'c.

Each cell includes a counter register 50 and a corresponding control register 60. Each register 50 includes a D input coupled to an EXCLUSIVE OR gale 54 as described above in FIG. 3B. Each register 60 provides its Q output to a first input of an AND gate 52. The other input for each AND gate 52 receives one bit of the N value. The output of each AND gate 52 represents a SKIPIT signal. Thus, depending on the value of the N bit, the SKIPIT signal will be or will not be generated when the Q output of the corresponding register 60 presents the enable pulse 122 as a logic value one.

The Q output of each register 60 also applies to the first input of an OR gate 62. The second input of each OR gate 62 receives a bit from a maximum length control M. Each bit in the maximum length control M applies to a corresponding one of cells 12'a–12'c. Bit $M_0$ applies to the OR gate 62 of cell 12'a, bit $M_1$ to the OR gate 62 of cell 12'b, and bit $M_2$ to the OR gate 62 of cell 12'c. The output of each OR gate 62 applies to the first input of an AND gate 64. Each AND gate 64 receives at its second input a corresponding one of the clock signals. More particularly, the AND gate 64 of cell 12'a receives at its second input CLOCK__0 (24), gate 64 of cell 12'b receives CLOCK__1 (102), and gate 64 of cell 12'c receives CLOCK__2 (104). Each AND gate 64 cuts in half the width of the enable pulse 122 as it propagates through registers 60. Each OR gate 62 dictates whether or not a given cell participates in counting. By disabling one or more of the most-significant cells by corresponding bits in control value M, the effective length of counter 12' shortens and its base count decreases.

Counter 12' as illustrated in FIG. 4 has a base count established a, a function of the number of participating registers or cells. A three-bit counter with all registers participating has a base count of eight input clock cycles. Counter 12' operates at its base count when all bits in the values N and M are zero, i.e., when no state transitions are skipped and when all registers 50 are participating in counting. A count cycle period may be increased upward relative to the base count by application of an appropriate N value. Each bit in the N value adds a corresponding number of CLOCK__IN 24 cycles to each count cycle, i.e., to the period of each CLOCK__OUT 26 cycle. Thus, CLOCK__OUT 26 signal may be operated at almost one octave relative to the base count.

Logic 80 generates the values N and M as illustrated in FIG. 4 in response to external programming circuitry designating a divide value, i.e., a value $N_p$, where $N_p$ represents the actual number of clock 26 cycles for one period of the CLOCK__OUT 26 signal. The values N and M as illustrated in FIG. 4 are a function of a programming divide by $N_p$ value. The value N represents cycles to be added to a base count and the value M establishes the base count. However, such values N and M may be easily computed by logic 80 from a given $N_p$ value established in a prior programming step, i.e., from an external process.

Figure 5A:
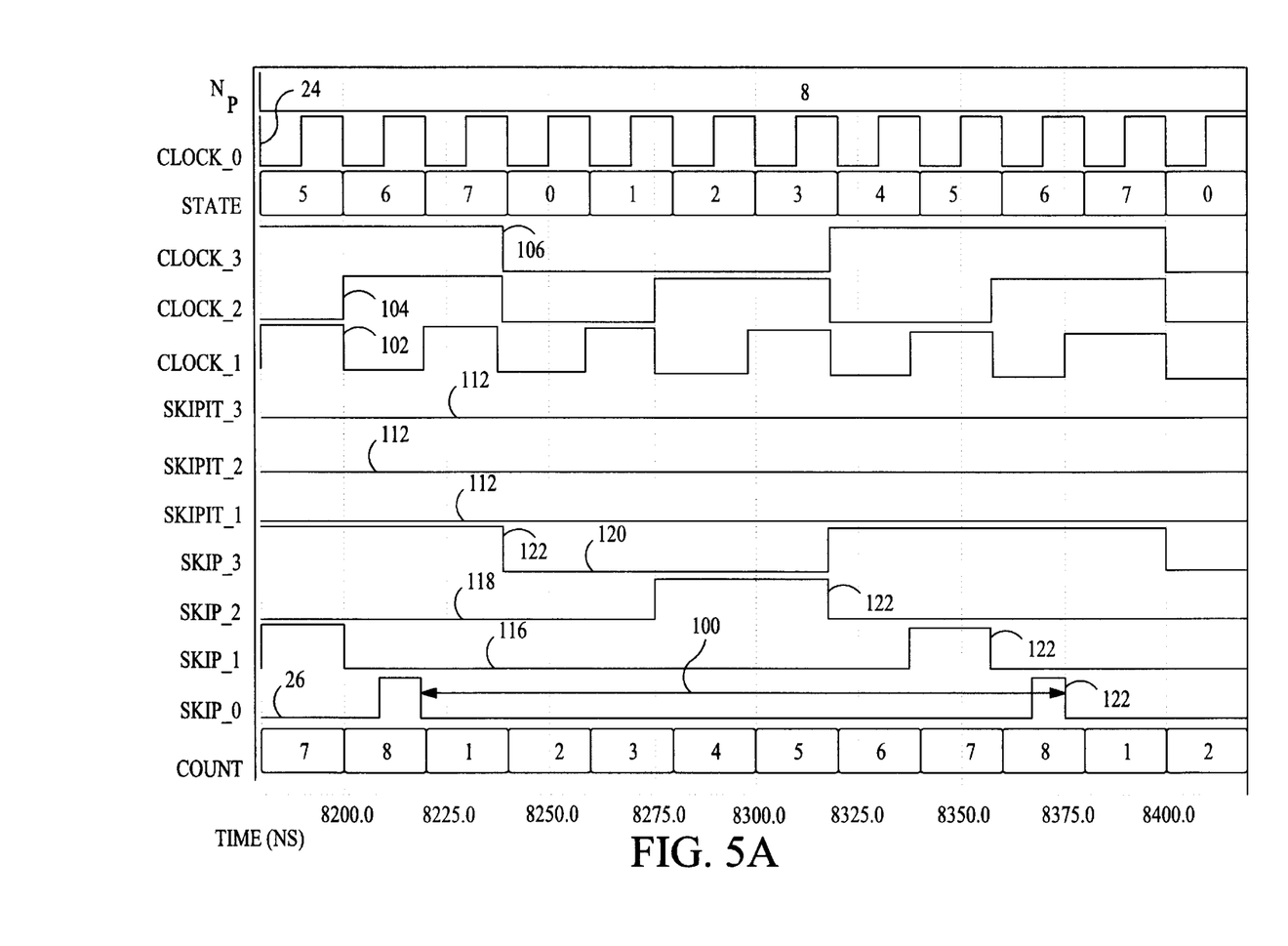
FIGS. 5A–5D are timing diagrams illustrating operation of the programmable ripple counter of FIG. 4 operating in different programmed modes.

FIG. 5A illustrates operation of counter 12' when programmed for a count cycle 100 of eight CLOCK__IN (CLOCK__0) 24 cycles for each CLOCK__OUT (SKIP__0) 26 cycle. Thus, FIG. 5A illustrates operation of counter 12' at its basic count capability where no state transitions are inhibited (N=0) and all registers participate in the counting operation (M=0). Count cycle 100 corresponds to successive falling edges in SKIP__0 (26). Because operation illustrated in FIG. 5A does not inhibit any state transitions in registers 50, CLOCK__1 (102), CLOCK__2 (104), and CLOCK__3 (106) operate as in a normal ripple counter. In other words, CLOCK__1 (102) operates at half the frequency of CLOCK__0 (24). Clock 104 operates at half the frequency of clock 102 and clock 106 operates at half the frequency of clock 104. Because no state transitions are ignored, the SKIPIT signals 108, 110, and 112 all remain at zero, i.e., bits $N_0$–$N_2$ are at logic value zero, thereby always maintaining the corresponding SKIPIT signals at zero. SKIP__3 (120), SKIP__2 (118), SKIP__1 (116) and SKIP__0 (26) illustrate progression of the enable pulse 122 along the sequence registers 60. The enable pulse 122 is halved in length at each stage by virtue of the AND gate 64 and appears in the SKIP__0 (26) signal as the CLOCK__OUT 26 signal.

Figure 5B:
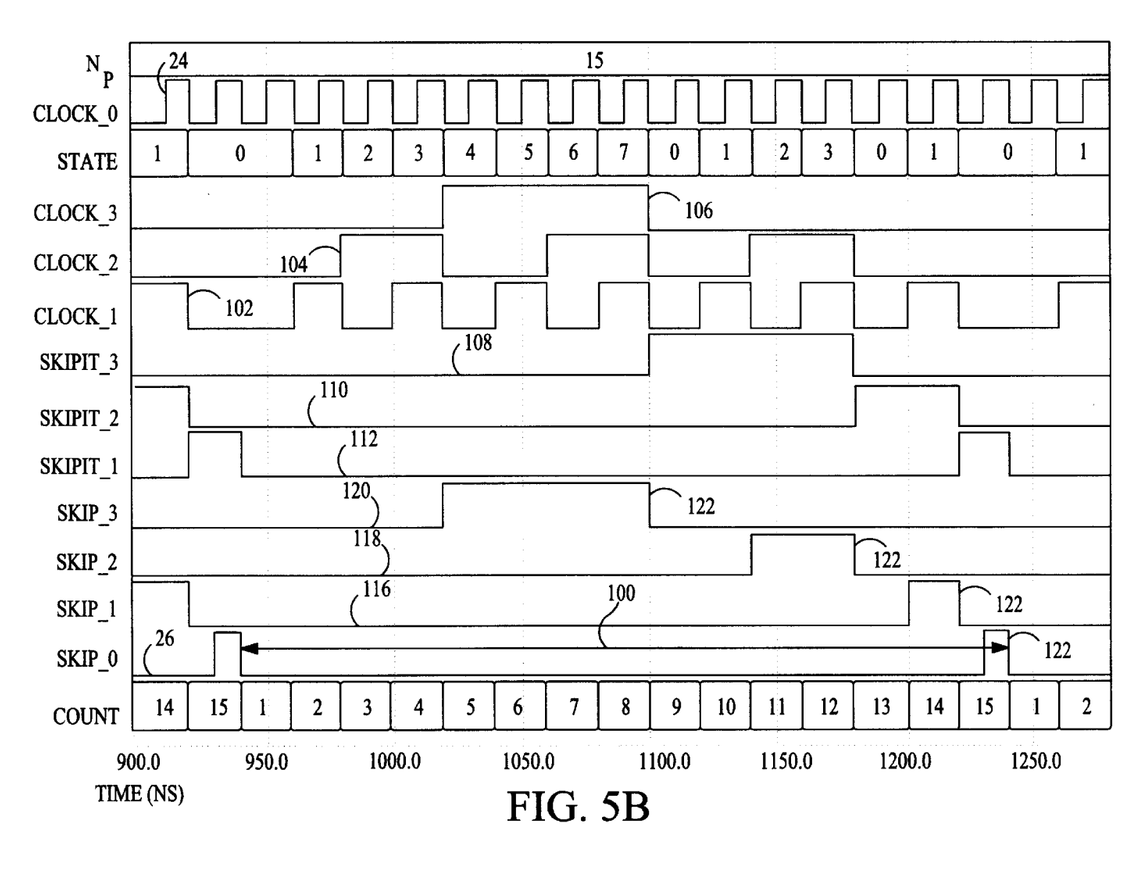

FIG. 5B illustrates operation of counter 12 at a maximum count value where all registers participate in the counting operation (M=0) and where a maximum number of state transitions are inhibited. Each of bits $N_0$–$N_2$ carry a logic value one and inhibit a corresponding number of state transitions, i.e., $N_0$ inhibits a register 50 (cell 12'a) state transition and lengthens the counter CLOCK__OUT 26 period by one CLOCK__IN 24 period, $N_1$ inhibits a register 50 (cell 12'b) state transition and lengthens the CLOCK__OUT 26 period by two CLOCK__IN 24 periods, and $N_2$ inhibits a register 50 (cell 12'c) state transition and lengthens the counter CLOCK__OUT 26 period by four CLOCK__IN 24 periods. This allows a total of seven skipped state transitions. The total count for counter 12 in this programming configuration is the base count capability, i.e., eight, plus the number state transitions inhibited, i.e., seven, for a total of fifteen CLOCK__IN 24 cycles for each CLOCK__OUT 26 cycle. Thus, the count cycle 100 illustrated in FIG. 5B represents the maximum count capability for a three-bit counter.

Figure 5C:
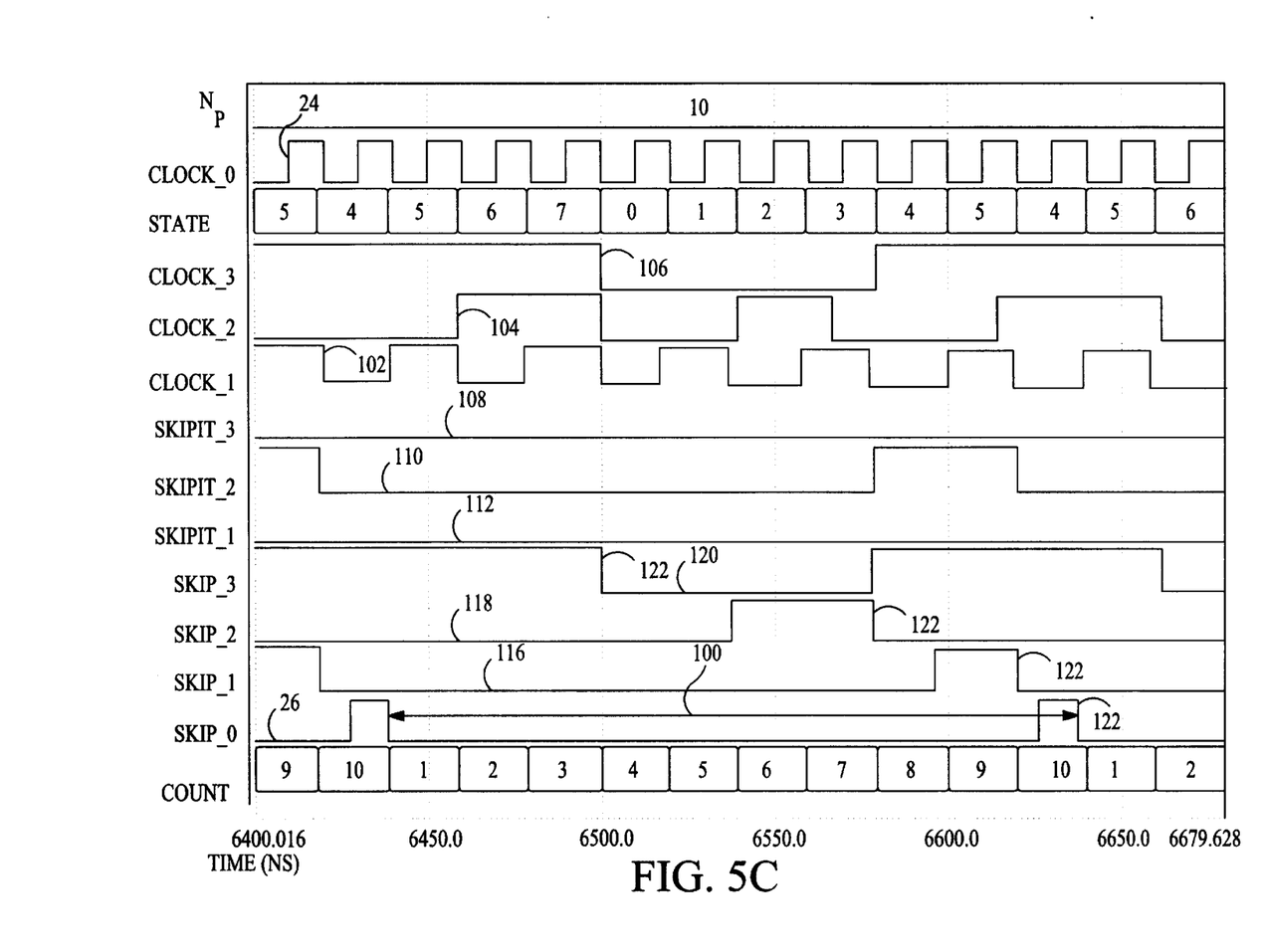

FIG. 5C illustrates a count cycle 100 corresponding to ten CLOCK__IN 24 cycles for each CLOCK__OUT 26 cycle. In this example, control value M equals zero (all bits), $N_0$ equals zero, $N_1$ equals one, and $N_2$ equals zero. This establishes a base count of eight and register 50 (cell 12'b) skips one state transition per count cycle thereby adding two CLOCK__IN 24 cycles to the CLOCK__OUT 26 period.

Figure 5D:
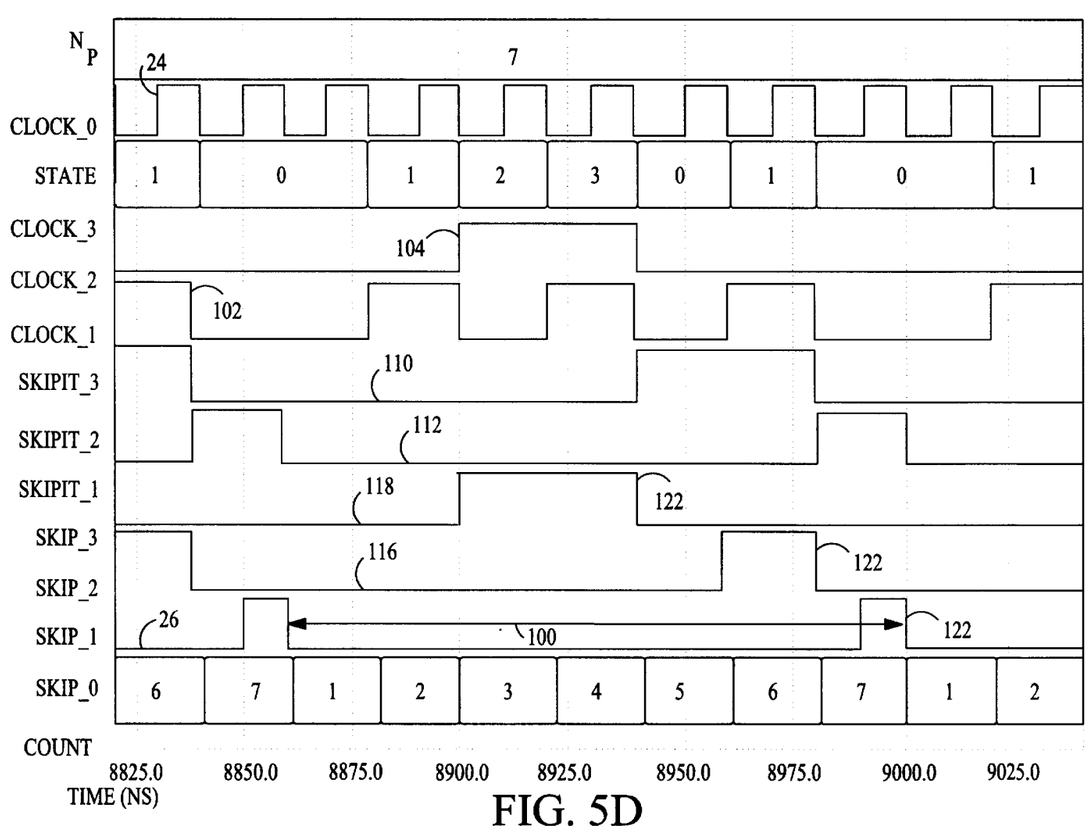

FIG. 5D illustrates operation of counter 12' when the maximum length control M in effect shortens the length of counter 12' and thereby shifts the range of programmability available through the value N. In this particular example, counter 12' has been programmed for a count cycle 100 having seven CLOCK__IN 24 cycles for each CLOCK__OUT 26 cycle. To accomplish this, $M_0$ equals zero, $M_1$ equals zero, $M_2$ equals one, $N_0$ equals one, $N_1$ equals one, and the value of $N_2$ is irrelevant. Accordingly, the portion 12'c has been effectively removed from operation by setting $M_2$ to a value one. This gives a base count of four and a range of count from four to s,even. Three additional cycles are added to the base count by setting $N_1$ and $N_0$ each to the value one resulting in a total of seven CLOCK__IN 24 cycles for each CLOCK__OUT 26 cycle.

Counter 12' as a three-bit counter has, by appropriately applying values N and M as indicated, a count range between one and fifteen, i.e., a count cycle 100 having a selectable length period between one and fifteen CLOCK__IN 24 cycles.

The timing diagrams illustrated herein and discussion of circuit operation assume a zero signal propagation delay through the various components. In an actual implementation, however, signal propagation delays do exist and would affect the presentation of timing relationships as illustrated. Any such propagation delays, however, do not affect the logic or sequential steps executed as described thus far and as represented in the timing charts. Since each cell 12 is connected only to the previous and next cell 12, propagation delays are of consequence between adjacent cells 12. Thus, the ripple delay, i.e., along the counter, need not be considered. Accordingly, signal propagation delays are of local concern only, i.e., affect only a cell in and its adjacent cells. But the total delay along the counter is not of concern. Thus, an improved ripple counter has been shown and described with general purpose programmability, i.e., programmability by an arbitrary value $N_p$ not limited to a power of two. Because the counter of the present invention operates generally in the fashion of a ripple counter, power consumption in many logic families, such as CMOS, is substantially reduced relative to similar synchronous-type programmable counters.

The overall architecture of the counter as shown herein naturally isolates the various signals to the cells. With exception of the static values M and N, all signals affecting operation of the cell are generated within that cell or by an immediately adjacent cell. Accordingly, this arrangement allows for a counter of any length without limitations as to the total counter propagation delay.

It will be appreciated that the present invention is not restricted to the particular embodiment that has been described and illustrated, and that variations may be made therein without departing from the scope of the invention as found in the appended claims and equivalents thereof.

What is claimed is:

1. In a ripple counter having a series of count registers toggling state in response to a triggering event in an input signal, a first one of said count registers receiving a clock as its input signal, the remaining ones of said series of registers each receiving the state of another register as an input signal, an improvement establishing programmability comprising:

intervening circuitry selectively inhibiting toggling of selected ones of said series of count registers.

2. An improvement according to claim 1 wherein said intervening circuitry removes selected clock cycles.

3. An improvement according to claim 1 wherein said intervening circuitry inhibits state transition in response to a triggering event.

4. An improvement according to claim 1 wherein said triggered event is an edge-triggered input.

5. An improvement according to claim 1 wherein said control circuitry comprises a series of control registers.

6. An improvement according to claim 5 wherein enable pulse propagates along said series of control registers.

7. An improvement according to claim 6 wherein inhibiting a count register toggle is in response to presentation of said enable pulse and a count programming value.

8. An improvement according to claim 6 wherein said enable pulse first enters said series of count registers as the state output of a terminal one of said count registers.

9. An improvement according to claim 1 further comprising length control circuitry limiting the number of said count registers participating in counting.

10. A ripple programmable counter comprising:

a series of count registers each having a triggered input, providing a state output, and toggling state in response to a triggering event at its triggered input, a first one of said count registers receiving a clock input at its triggered input, other than a terminal of one of said series of registers, each register providing its state as an input signal to a next successive one of said series of count registers, a series of control registers responsive to said series of count registers by intervening to selectively inhibit toggling in selected ones of said series of count registers.

11. A counter according to claim 10 wherein said control registers remove selected clocks cycles.

12. A counter according to claim 10 wherein said control registers inhibit state transition in response to a triggering event.

13. A counter according to claim 10 wherein said triggered event is a signal edge event.

14. A counter according to claim 10 wherein said control registers propagate an enable pulse therealong.

15. A counter according to claim 14 wherein said control registers inhibit a count register toggle in response to presentation of said enable pulse and a count programming value.

16. A counter according to claim 10 wherein said enable pulse first enters said series of control registers as the state output of said terminal one of said count registers.

17. A counter according to claim 10 further comprising length control circuitry limiting the number of said count registers participating in counting.

* * * * *